United States Patent [19]
Childers et al.

[11] Patent Number: 5,671,187
[45] Date of Patent: Sep. 23, 1997

[54] STORAGE CIRCUIT

[75] Inventors: Jimmie Don Childers, Missouri City, Tex.; Seiichi Yamamoto, Inashiki; Masanari Takeyasu, Tsukuba, both of Japan

[73] Assignee: Texas Instruments Incorporated, Dallas, Tex.

[21] Appl. No.: 475,269

[22] Filed: Jun. 7, 1995

[51] Int. Cl.[6] .................................................. G11C 7/06
[52] U.S. Cl. ........................ 365/205; 365/203; 365/208; 365/189.09; 365/189.11
[58] Field of Search .................................. 365/203, 205, 365/207, 208, 189.09, 189.11

[56] References Cited

U.S. PATENT DOCUMENTS

| | | | |
|---|---|---|---|
| 4,584,672 | 4/1986 | Schulz et al. | 365/205 |
| 4,739,500 | 4/1988 | Miyamoto et al. | 365/207 |
| 4,947,377 | 8/1990 | Hannai | 365/205 |
| 5,016,224 | 5/1991 | Tanaka et al. | 365/207 |
| 5,053,997 | 10/1991 | Miyamoto et al. | 365/203 |
| 5,132,930 | 7/1992 | Furutani et al. | 365/205 |

Primary Examiner—Joseph E. Clawson, Jr.
Attorney, Agent, or Firm—Gerald E. Laws; C. Alan McClure; Richard L. Donaldson

[57] ABSTRACT

A processor (10) comprises a plurality of processing elements each having an input register (11), first memory bank (12), first sense amplifier (40), ALU (13), output register (16), second memory bank (15) and second sense amplifier (42). The first sense amplifier (40) is shared between the input register (11) and first memory bank (12). The second sense amplifier (42) is shared between the output register (16) and second memory bank (15). The sense amplifier (40,42) may be paused to prevent voltage spikes during a read/write operation, or to wait until a calculation is completed.

20 Claims, 6 Drawing Sheets

STORAGE CIRCUIT

RELATED APPLICATIONS

This application is related to U.S. patent application Ser. No. 486,984, (TI-14621), filed Mar. 1, 1990, now Ser. No. 07/918,161 (TI-14621A), filed Jul. 21, 1992, now Ser. No. 08/227,705 (TI-14621B), filed Apr. 14, 1994, currently pending; Ser. No. 119,890, (TI-13116), filed Nov. 13, 1987, abandoned/combined; Ser. No. 435,862, (TI-13116A), filed Nov. 13, 1989, abandoned/combined; Ser. No. 541,458, (TI-13116B), filed Jun. 22, 1990, abandoned/combined; Ser. No. 658,426, (TI-13116C), filed Feb. 20, 1991, abandoned/combined; Ser. No. 895,146, (TI-13116D), filed Jun. 5, 1992, pending; and Ser. No. 119,889, (TI-13117), filed Nov. 13, 1987, abandoned/combined; Ser. No. 256,150, (TI-13117A), filed Oct. 6, 1988, abandoned/combined; Ser. No. 323,045, (TI-13117B), filed Mar. 10, 1989, abandoned/combined; U.S. Pat. No. 4,939,575, (TI-13117C) issued Jul. 3, 1990. These applications have a corresponding European Patent Application No. 0 317 218, filed Nov. 11, 1988, and published May 24, 1989. This application is also related to U.S. Pat. No. 5,163,120, (TI-13496), issued Nov. 10, 1992; and Ser. No. 435,591, (TI-14608), filed Nov. 17, 1989, abandoned/combined; Ser. No. 933,865, (TI-14608A), filed Aug. 21, 1992, pending. These applications and the instant application are assigned to Texas Instruments Inc., and the contents of these applications are hereby incorporated herein by reference.

TECHNICAL FIELD OF THE INVENTION

This invention relates in general to integrated circuits, and more particularly to storage circuitry.

BACKGROUND OF THE INVENTION

Many technologies, such as video signal processing, require massive data handling and processing in a short time interval. Real-time video signal processing requires that the operating processors receive and process the video signal at extremely fast rates. In order to process data quickly, multiple processors are used, as described in U.S. patent application Ser. No. 5,163,120, filed Oct. 13, 1989, which is incorporated by reference herein.

In a parallel processing system, such as that disclosed in the above-referenced application, many memories will be accessed simultaneously. With dynamic memory cells, a sense amplifier is used to read from and write to the cells through a plurality of bit lines. The sense amplifiers include N channel and P channel flip flops. At some point during a sense operation, the voltage on the bit lines may be such that a low impedance path is formed through an N channel and a P channel transistor, resulting in a voltage spike. With many simultaneous sense operations being performed simultaneously, a large voltage spike may occur which could generate excessive noise within the circuit.

Further, an arithmetic logic unit (ALU) is often associated with the sense amplifier such that data may be read from the memory, modified by the ALU, and written back to the memory. It is important that the sense amplifier be activated precisely at the moment that the calculation is completed. If the sense amplifier is activated before the calculation is complete, erroneous information may be written back into the memory. On the other hand, if the sense amplifier is activated too late, the write cycle is extended, reducing the speed of the circuit.

Therefore, a need has arisen for a sense amplifier/memory configuration which provides high speed operation without the danger of voltage spikes. Further, a need has arisen for a sense amplifier/ALU circuit which provides precise timing of sense operations in relation to ALU calculations.

SUMMARY OF THE INVENTION

In a first aspect of the present invention, storage circuitry is provided which comprises a register comprising a plurality of dynamic memory cells, a memory bank comprising a plurality of random access memory cells and a sense amplifier located between the register and memory bank operable to sense the state of the memory cells of the register and memory bank.

This aspect of the present invention provides the advantage of high-speed sensing while reducing the bar size by using a sense amplifier to read both the register and the memory bank. Further, the location of the sense amplifier between the register and the memory bank provides efficient data propagation for high-speed sensing.

In a second aspect of the present invention, a sense amplifier comprises a high sensing circuitry for coupling a first voltage node associated with a first voltage source to a first or second sensing node responsive to a voltage differential between the first and second sensing nodes. Low sensing circuitry is provided for coupling a second voltage node associated with a second voltage source to a third or fourth sensing node responsive to a voltage differential between the third and fourth sensing nodes. Pause circuitry is provided for selectively decoupling at least one of the voltage node from its respective voltage source in order to prevent a low impedance connection between the voltage sources.

This aspect of the present invention provides the technical advantage of reducing noise in the storage circuitry caused by excessively high currents.

In a third aspect of the present invention, reactivating circuitry is provided for recoupling said one of the voltage nodes to its respective voltage source responsive to a signal when data input to the sense amplifier is valid. This aspect of the present invention provides the technical advantage that the sense amplifier is paused for a minimum period of time in order to maximize the efficiency of the sense amplifier.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Serial Video Processor

Figure 1:
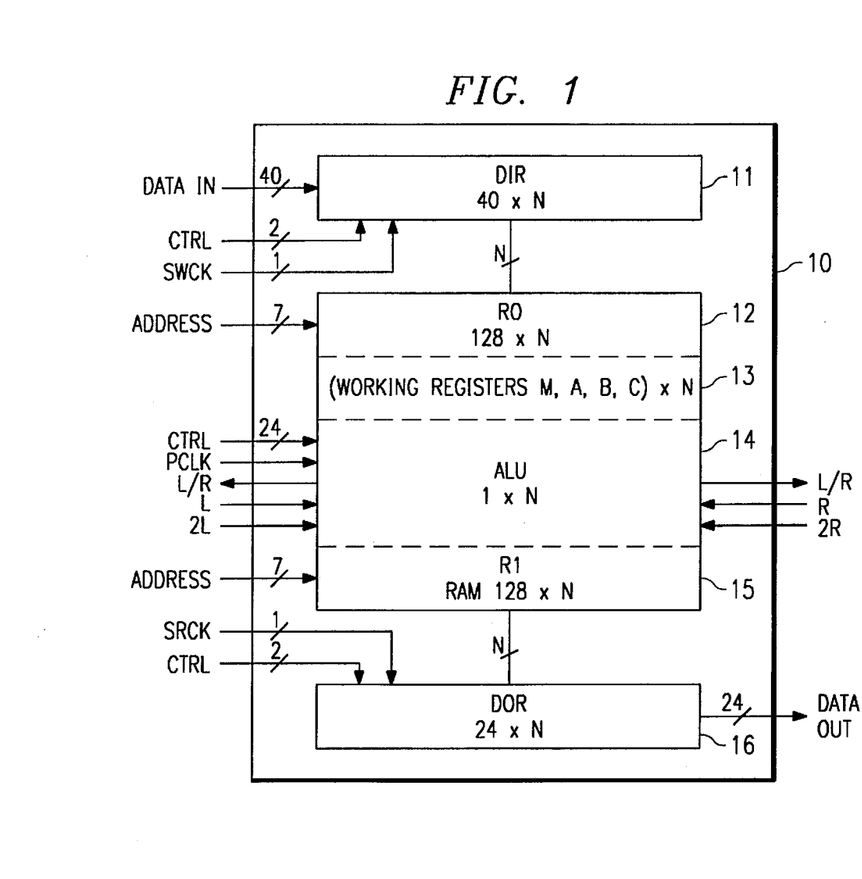
FIG. 1 is a block diagram of a representative parallel processor used for synchronous vector input.

FIG. 1 illustrates an example of a serial video processor (SVP) 10, which may also be described as a synchronous vector processor (also SVP). The SVP 10 of FIG. 1 is the subject of the co-pending patent applications cited above. Subsequent sections of this application are directed to devices and processes that use SVP 10. However, these devices and processes are not necessarily limited to use with this particular SVP 10, and variations of SVP 10 may be used.

The "serial video" aspects of SVP 10 derive from the fact that it is particularly suited for video processing, where discrete packets of incoming data, which have a uniform size, are input and output serially but are processed in parallel. The "synchronous vector" aspects of SVP 10 derive from the fact that it receives and processes data vectors in synchronization with a real-time data source.

Essentially, SVP 10 operates by using fine-grained parallelism techniques in which many processing elements operate on the data concurrently.

SVP 10 is a general purpose, mask-programmable, single instruction multiple data (SIMD), reduced instruction set computing (RISC) device. Consistent with the SIMD characteristic, SVP 10 has a number of processing elements (PE's), which execute the same instruction at the same time. External microinstructions control primitive logic and arithmetic functions for each clock cycle.

Figure 2:
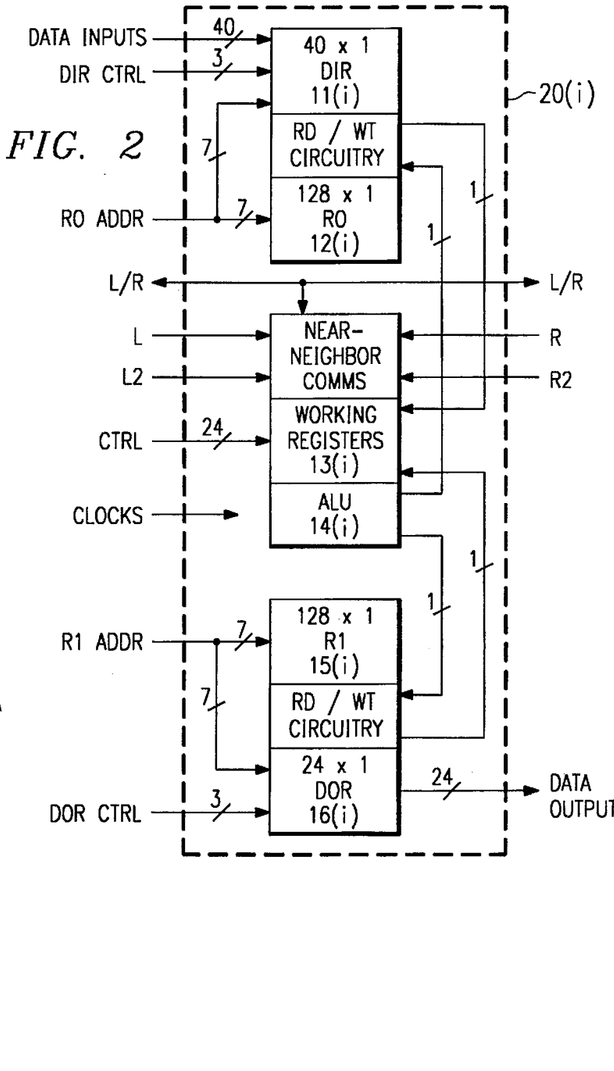
FIG. 2 is a block diagram of a processing element of the processor of FIG. 1.

Referring to FIGS. 1 and 2, SVP 10 is a one-dimensional array of one-bit PE's 20. Each PE 20 has the following basic components: a data input register (DIR) 11, two independently addressed register files (R0 and R1) 12 and 15, a set of working registers (WR's) 13, a one-bit arithmetic unit (ALU) 14, and a data output register (DOR) 16. These are described briefly in this section, and reference to the related patents cited above will provide further description, especially with regard to instructions and timing.

DIR 11 can be thought of as the "input layer." R0 12 and R1 15, the WR's 13, and the ALU 14 are the "computational layer." DOR 16 is the "output layer." Although each layer may be independently clocked across each layer, all PE's 20 operate in unison, every clock cycle. The input to DIR 11 is word-serial in the sense that words of an incoming packet of data are received into DIR 11 word by word. Similarly, the output from DIR 16 is word-serial.

Although input and output are word-serial, processing of each data packet is parallel. Also, because of the "layered" approach to processing, data input, computation, and data output may be concurrent operations, with each being independently clocked. Each PE 20 performs these operations on an entire vector of data at once, and is thus a "pipeline" that enables several operations to be in various stages at once. When a vector instruction is executed, the elements of the vector are fed into the appropriate pipeline one at a time, that enables several operations to be in various stages at once. When a vector instruction is executed, the elements of the vector are fed into the appropriate pipeline one at a time, delayed by the time it takes to complete one stage of the pipeline. Input and output are in synchronization with the data source, such as a video camera, and with the data sink, such as a raster scan display.

For purposes of illustration, SVP 10 has N number of PE's 20, where N=1024. The memory size is 256 bits for each PE 20, with 128 bits each for R0 and R1, DIR 11 is 40-bits wide and DOR 16 is 24-bits wide. These sizes are discretionary, however, and may be changed without changing the substance of the invention. The input and output bit sizes are included in FIGS. 1 and 2 to illustrate various input/output and device size relationships. However, these bit sizes may be varied according to the application.

Using these values, a single SVP 10 can process data packets of 1-to-1024 words by 40-bits. Typically, the packets are equal in size and represent periodically recurring data, such as lines of a television image, where each packet is digitized into N number of data samples, and where each sample, $S(i)$, $i=1 \ldots N$, is a data word used to generate an output word. In television applications, where SVP 10 has N PE's 20, N also represents the number of data samples per line.

FIG. 2 illustrates a single PE 20(i) and its associated components, where $i=1 \ldots 1024$. A vertical slice through SVP 10 of FIG. 1 yields an individual PE 20 of FIG. 2, thus each PE 20(i) and its components are referred to herein as a "column" with respect to the entire array of SVP 20.

DIR 11 and DOR 16 are the basic I/O devices of SVP 10. Both DIR 11 and DOR 16 are arrays of sequentially addressed, dual-ported memory cells. As used in this description, "DIR 11" refers to the entire array, and "DIR 11(i)" refers to the column of DIR 11 that receives data sample $S(i)$. A special dual configuration of DIR 11 is described in a subsequent section of this application, but the following general description is applicable.

Referring to both FIGS. 1 and 2, the input array size of SVP 10 permitted by DIR 11 is 1024 words×40 bits. One port of DIR 11 is organized as 1024 words of 40 bits each and permits DIR 11 to be written into from a 40-bit input line in parallel. Thus, this first port of DIR 11 emulates the write port of a 1024-word line memory, which permits word-serial input. The second port of DIR 11 is organized as 40 words of 1024 bits each, where each bit corresponds to a PE 20(i). This second port provides an interface between DIR 11 and PE's 20. It is physically a part of, and is mapped into, the absolute address space of R0 12. This permits the contents of DIR 11 to be addressed for selection to write into memory and is read in parallel.

Like DIR 11, DOR 16 is a two-port device. In a manner similar to DIR 11, it provides 1-bit access to each ALU 14(i) and 24-bit output from SVP 10. One port of DOR 16 is organized as 1024 words of 24 bits each. This port functionally emulates the read port of a 1024-word line memory and is used for word-serial output. The second port of DOR 16 is organized as 24 words of 1024 bits each, where each bit corresponds to a PE(i). This second port couples to R1 15, and is written to in parallel. R0 12 and R1 15 each have 128 words by one bit of read/write memory per PE 20. Different addressing structures cover the R0 12 and R1 15. However, R0 12 and R1 15 are comprised of random access memory (RAM) cells. Each R0 12(i) and R1 15(i) is independently addressable, and is capable of 1-bit read-modify-write cycle such that it can be read, the data operated on by ALU 14, and the result written back to it in a single clock cycle. R0 12 and R1 15 read data at the same time, but write separately.

The working register (WR) set 13(i) for each PE 20(i) comprises four registers: M, A, B, and C. These registers are the same, except for their data sources and destinations. Each WR 13(i) is associated with an input multiplexer for providing data to the four inputs of each ALU 14(i). The M register is used for division, multiplication, and logical and conditional operations. Registers A, B and C are addend, minuend, and carry/borrow registers, respectively.

ALU 14 is a simple full adder/subtracter and a one-bit multiplier. The inputs to ALU 14 are from the WR's 13. These ALUs carry out whatever instruction is specified by the control unit of SVP 10. A feature of SVP 10 is that each ALU 14 executes instructions from a set of instructions that operate on data directly. A control unit, which feeds an instruction stream to SVP 10 has an additional set of instructions that provide basic execution control.

A left/right (L/R) bus 41 provides direct memory and register read/write from each PE 20 to its four nearest neighbor PE's 20, i.e., the two PE's 20 to the left and the two PE's 20 to the right. To accomplish such communication, each PE 20 generates one output, which is fanned out to its four neighbor PE's 20. This output may be from any one of four sources: a logical 0, the contents of the B register of WR 13, or a location from either R0 12 or R1 15. Each PE 20 also receives four signals, one from each of its four nearest neighbors.

Sample SVP Video Applications

As indicated above, SVP 10 is especially useful for digital video processing. Each signal segment that represents a horizontal line of an incoming television signal is digitized as a data "packet" comprised of a data samples. SVP 10 loads, processes, and outputs data for each pixel on a horizontal line in parallel. The architecture of SVP 10 permits data vectors from multiple pixels, multiple lines, or multiple fields to be processed in parallel, and hence SVP 10 is capable of the "three dimensional processing" required for digital television.

A particular advantage of using SVP's 10 is that discrete line memories are not required. Line-by-line storage is emulated in the processing of SVP 10, using a software procedure, referred to as "global rotation." This procedure is explained in the above-cited U.S. Pat. No. 5,163,120.

Figure 3A:
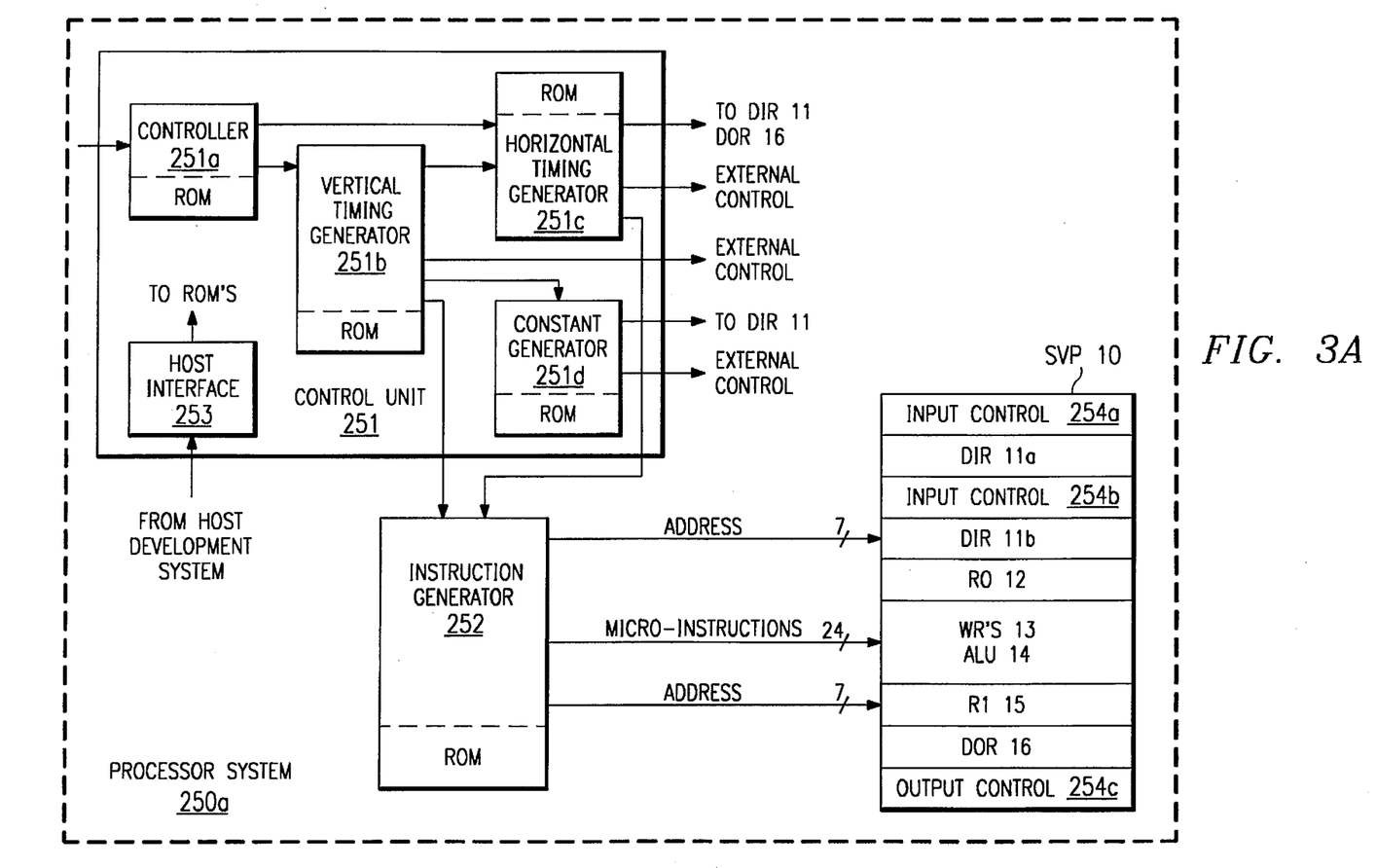
FIG. 3a is a block diagram of a typical digital processing unit that includes the processor of FIG. 1.

FIG. 3a illustrates a basic processor system 250a having a single SVP 10. The television receiver circuitry surrounding processor system 250a is described in connection with FIG. 3b, which also illustrates data inputs to SVP 10. In contrast, FIG. 3a illustrates the control, address, and instruction inputs to SVP 10, and may be supplemented with the description of the same circuits in the above-cited U.S. patent application, Ser. No. 421,499.

Referring now to FIG. 3a, the basic components of processor systems 250a are SVP 10, an SVP control unit 251, and an instruction generator 252. The use of one SVP 10 versus more than one SVP 10 is dependent on the complexity of the processing tasks and hence, on the execution time. For full-screen real-time video processing, the operations performed on a line of picture data must be executed in a single 1H period, where H represents the period of one horizontal scan line. However, if 1H is not enough time, more than one SVP 10 may be interconnected and processing tasks partitioned among them.

Each SVP 10 need not have the exact configuration of FIGS. 1 and 2. As already stated, the distinguishing characteristics of an SVP 10 is the ability to process a data packet representing a data packet consisting of an entire line of a television picture in parallel, using a processing element for each pixel.

As shown in FIG. 3a, for component television processing, DIR 11 is divided into a chrominance DIR 11a and a luminance DIR 11b. Each DIR 11a and 11b is 20-bits wide rather than 40-bits wide as in FIGS. 1 and 2. DIR 11a has 1024 positions for 512 data samples from odd and even lines. DIR 11b has 1024 positions, but only 1023 are used.

The second port of each DIR 11a and 11b, i.e., the port that interfaces with R0 12 and R1 15, is 20×1024.

Input control units 254a and 254b for each DIR 11a and 11b may perform more than one type of input control, depending on the particular application. For loading DIR 11, control circuits 254a and 254b includes a means for controlling the WE signal, which is triggered to begin at the end of a horizontal blanking period and clocked so that all columns of DIR 11 are loaded during one horizontal scan period. Input control units 254a and 254b also control what type of data is received into SVP 10.

SVP control unit 51 has several components: controller 251a, vertical timing generator 251b, horizontal timing generator 251c, and constant generator 251d. Ideally, each of these devices is programmable and accesses its own program store memory. In FIG. 3a, each of these components has its own read only memory (ROM). To facilitate development of processing tasks, programs may be developed on a host system (not shown) and downloaded to each ROM, using standard interface techniques. A host interface 253 may be for either parallel or serial data transfers, for example an RS-232C interface.

In operation, SVP control unit 51 generates control signals for SVP 10, which are synchronized with the vertical synchronization signal and the horizontal synchronization signal of the incoming television transmission. These control signals include operating constants, instructions, and timing signals. As an overview of the timing operation of SVP control unit 251, controller 251a controls the video signal processing at a field or frame rate, vertical timing generator 251b controls processing at a line rate, and horizontal timing generator 251c controls processing at a pixel rate.

SVP control unit 51 also provides timing and control signals to other system components, such as for horizontal and vertical synchronization. These latter timing signals are "external" in the sense that they do not control processor system 250a. Instead they control devices such as field memories, as described in subsequent sections of this application.

Figure 3B:
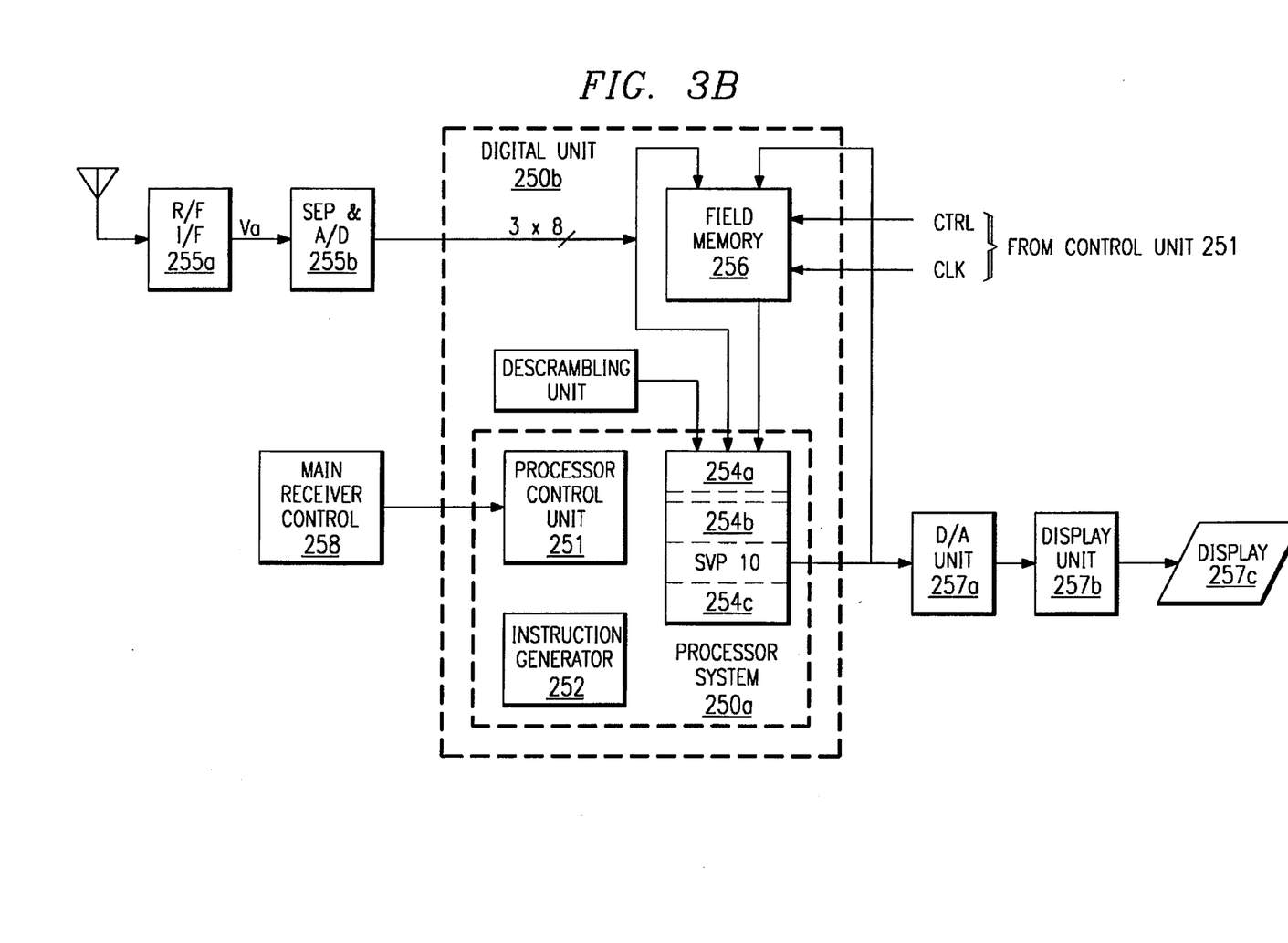
FIG. 3b is a block diagram of a typical television receiving system that includes the apparatus of the present invention.

Controller 251a receives and interprets external commands from a main television control unit (shown in FIG. 3b). It generates a series of control codes to vertical timing generator 251b and horizontal timing generator 251c. Controller 251a is programmable with a variety of instructions, including conditional and vectored jumps.

Vertical timing generator 251b provides control codes to horizontal timing generator 251c, constant generator 251d, and instruction generator 252. It provides timing to external circuits requiring a timing resolution of one horizontal line.

Horizontal timing generator 251c generates timing signals for circuits requiring timing edges at sample clock rates, such as DIR 11, DOR 16, field memories, and A/D and D/A converters (shown in FIG. 3b). It is capable of producing timing edges with a resolution as small as one sample clock.

Similarly, constant generator 251d provides constant values to individual PE's 20. There are two main reasons for using such constants. First, it is possible to map waveforms onto the PE's 20. Second, local constants distinguish the I chrominance signal from the Q signal, and permit the PE's 20 to multiplex and demultiplex the chrominance signal and to modify algorithms in the horizontal direction when merging two images. Instruction generator 252 receives algorithm specifier codes from vertical timing generator 251b and condition flags from horizontal timing generator 251c. It outputs a 23-bit micro-instruction to ALU 14, and two 7-bit addresses for R0 12 and R1 15. Also, instruction generator 252 provides basic execution control instructions, such as for jumps, calls and returns, test flags, and global rotation. Instruction generator 252 is associated with program storage, such as a ROM, to which instructions may be downloaded from a host system (not shown).

The various digital television processing tasks performed by processor system 251a may include scan conversion, motion detection, luminance and chrominance signal processing, and interpolation and decimation. Many of these tasks involve the use of filter algorithms to remove unwanted signal artifacts. Special configurations and programming for scan conversion and filtering are explained in subsequent sections of this application.

FIG. 3b is a block diagram of the basic components of a television receiving system, which includes processor system 250a. More specifically, processor system 250a is part of a digital unit 250b, which also includes field memory 256. The receiving system of FIG. 3b may be any one of a number of standard receiving systems for component television signals.

At the front end of the system, a video signal from an antenna or other source is detected in the usual manner through standard radio frequency/intermediate frequency RF/IF unit 255a, producing an analog video signal Va. Separation and analog-to-digital (A/D) unit 255b performs whatever demodulation or separation is required for the particular signal being used and converts the signal to digital sample data. This data, in digital form, is referred to herein as the "signal" due to the fact that it represents a continuous incoming picture signal. Although word sizes and sampling rates may vary, for purposes of example herein, typical sampling characteristics might be conversion of the analog signal into 8-bit samples at a sampling frequency of 14.318 MHz for NTSC.

For every pixel to be displayed, this conversion produces three parallel inputs to DIR 11 of SVP 10, i.e., a luminance sample and two chrominance samples. With a 40-bit DIR 11, each pixel value may be represented by a total of 40 bits. Typically, each sample is an 8-bit word, thus each pixel is derived from at least three 8-bit words.

Digital unit 250b has a processor system 250z and field memory 256. Field memory 256 is simply a standard first-in, first-out memory for storing fields of video data. Field memory 256 is actually comprised of a number of field memories 256(i), which provide digital unit 250b with the field-delayed data used for various processing tasks, especially temporal filtering. Each of these field memories 256(i) may be any one of a number of well known storage devices, such as the TMS4C1060, manufactured by Texas Instruments. Field memory 256 may be a bank of DRAMs, or because random access is not necessary, may merely provide serial input and output. Depending on the algorithms performed by ALU 14, field memory 256 may be part of a feedback path to SVP 10, or it may simply provide preprocessing or post-processing storage.

A main receiver control unit 258 receives external signals, such as those from a key pad, remote control, or video decoder. It decodes these signals and transmits them to other receive components, such as SVP control unit 251.

From digital unit 250b, the processed video data signal is output in parallel, as three 8-bit words to D/A unit 257a. The resulting signal from D/A unit 257a is the same analog signal that would be received by display unit 257b if processor system 50 were not included. Thus, digital unit 250b is simple interposed in the signal path at the output of a convention television receiver RF/IF unit 255a.

Display unit 257b is a standard unit for converting the processed signals into red, green, and blue signals. This is accomplished by the usual matrix techniques.

Display 257c receives the analog video signal from display unit 257. Typically, display 257c is of a raster scan type, such as a cathode ray tube. However, the invention could be used with any type of display having appropriate adapter circuits to use the signal generated by SVP 10. For example, display 257c could be used with a display memory (not shown) that receives the signal from processor system 250a and outputs all pixel elements in parallel.

Figure 4:
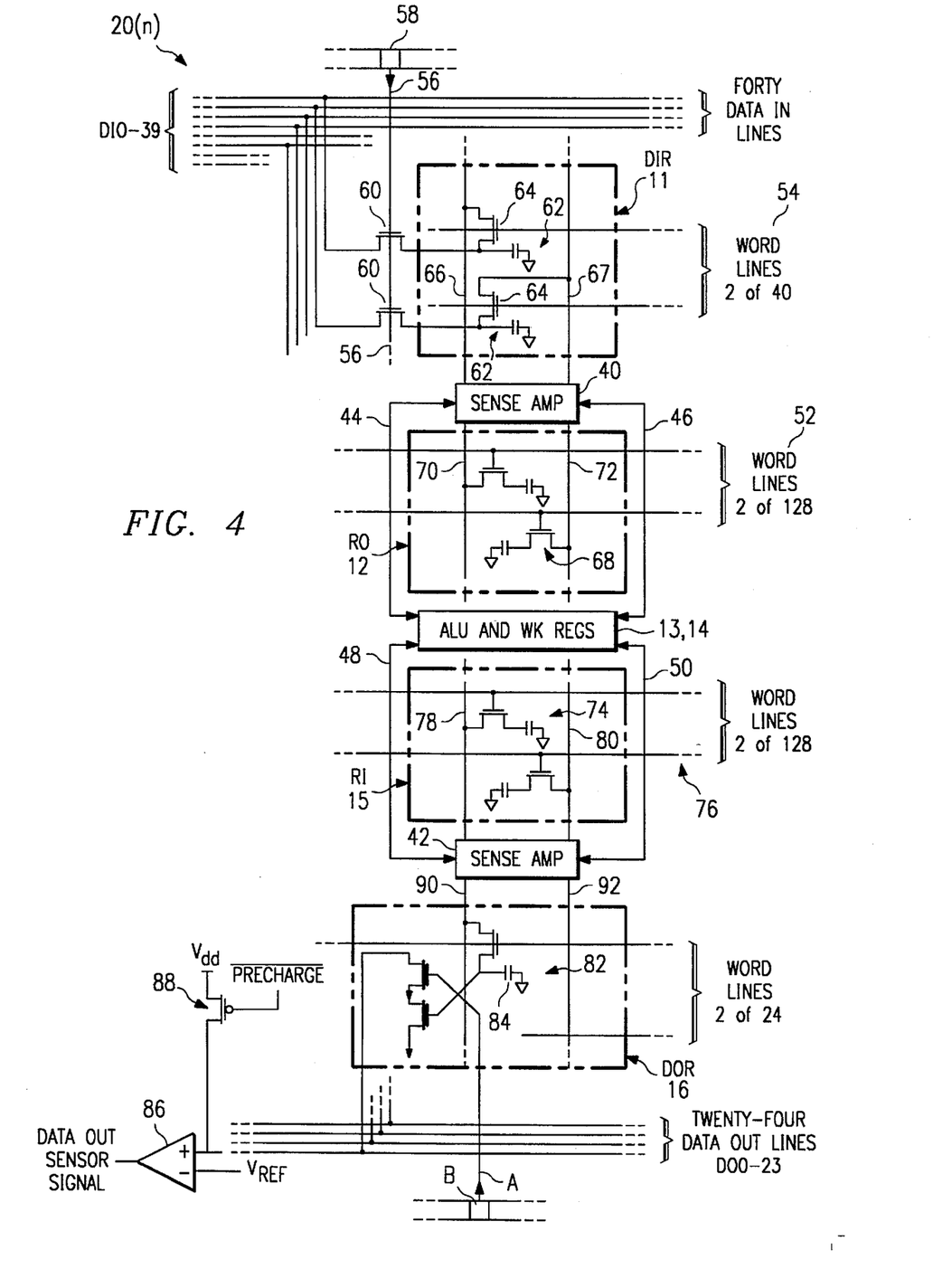
FIG. 4 is a block diagram of a processing element used in the present invention.

FIG. 4 depicts a circuit block diagram of a processing element showing input and output registers 11 and 16 and register files 12 and 15 in simplified schematic form. R0 12 comprises a 128-bit dynamic random-access memory configured as 1×128. R0 12 and the DIR input register 11 are parts of the same 1×168 DRAM column, but DIR 11 differs from R0 12 in that DIR 11 can be written into from the inputs DI0–39, forty bits in parallel. A similar arrangement exists for the subsystem comprising the DOR 16 and R1 15. However, the DOR 16 provides only 24 (DO0–23) parallel output lines.

Sense amplifier 40 services both the DIR 11 and R0 12, while sense amplifier 42 services R1 15 and DOR 16. Hence, for each processor element 20, two sense amplifiers are used. The sense data is transferred between the sense amplifier 40 and the ALU 14 (along with registers 13) via data lines 44 and 46. Data is transferred between the ALU 14 and the sense amplifier 42 via lines 48 and 50. The particular bit being addressed in memory R0 12 is selected from 128 wordlines 52 shared by all 1024 processor elements 20. Likewise, forty wordlines 54 are used to address the DIR 11. The wordlines 52 and 54 are common to all processor elements 20, such that the same bit/s is/are addressed simultaneously in the R0 12 and/or DIR 11 of each processing element 20 in the SVP 10.

Pointer input 56 from commutator 58 drives a set of forty input transistors 60 which connect forty data lines DI0–39 to dynamic memory cells 62 of the DIR 11. The memory cells 62 are dual-ported, and may be written to or read from through access transistor 64 and bitlines 66 and 67 when addressed by wordlines 54. The dual-ported cell allows reading and writing to be performed for each port simultaneously. The DIR 11 operates as a high-speed dynamic shift register, and the dual-port nature allows asynchronous communication of data into and out of the DIR 11. Although a dummy cell can be used, it is not a requirement for cell operation.

Memory R0 12 comprises a plurality of single-port memory cells 68 connected to wordlines 52 and to bitlines 70 and 72. Bitlines 66, 68, 70 and 72 are all connected to sense amplifier 40.

Similarly, memory R1 15 comprises single-port memory cells 74 connected to 128 wordlines 76 and bitlines 78 and 80. Bitlines 78 and 80 are connected to sense amplifier 42.

In the preferred embodiment, the DOR 16 utilizes a three-transistor dual-port gain cell 82. The DOR 16 operates as a high-speed dynamic shift register. The gain cell 82 allows reading of the capacitor 84 without destroying the stored charge. This aspect of the preferred embodiment is discussed in detail in U.S. Pat. No. 5,163,120, referenced above. Data is output from the DOR 16 over 24 data output lines DO0–24. A comparator 86 is connected to each output line to sense the signals. A reference voltage is applied to the comparator 86. The 24 data output lines DO0–24 are each connected to a P channel transistor 88 having a gate connected to a pre-charge signal and a source connected to $V_{dd}$. DOR 16 is connected to the sense amplifier 42 by bitlines 90 and 92.

As can be seen in FIG. 4, the sense amplifier 40 is located between the memory R0 12 and the DIR 11. This minimizes the signal delay in sensing the signals from the DIR 11 and R0 12. Similarly, sense amplifier 42 is located between R1 15 and DOR 16 to also reduce the signal delay.

Figure 5:
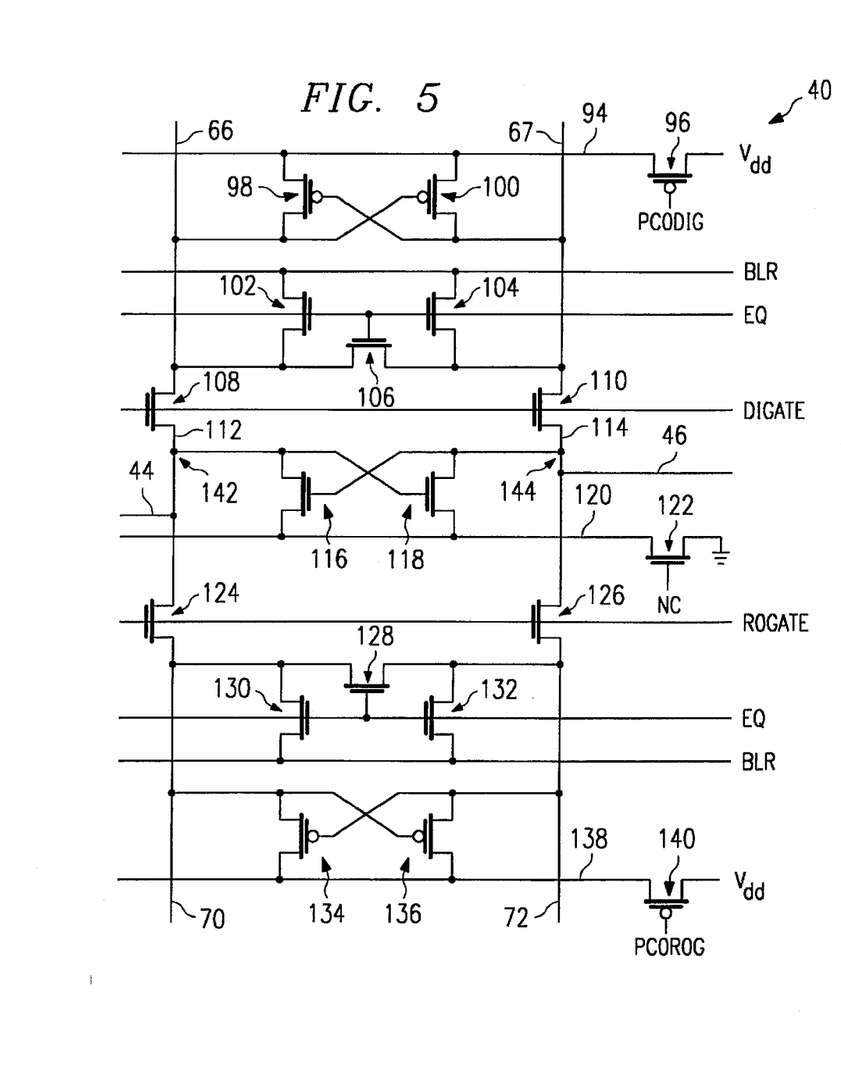
FIG. 5 is a circuit diagram of a sense amplifier used in the present invention.

FIG. 5 illustrates a schematic view of the sense amplifiers of the preferred embodiment. Although the preferred embodiment is being described in connection with DIR 11 and R0 12, a similar structure is equally applicable to R1 15 and DOR 16. $V_{dd}$ is connected to line 94 through P channel transistor 96. The P channel transistor 96 has a gate connected to the signal PC0DIG. Line 94 is connected to first source/drain regions of P channel transistors 98 and 100. P channel transistors 98 and 100 are connected in a cross-coupled flip flop configuration, with the gate of P channel transistor 98 and the second source/drain of P channel transistor 100 connected to bitline 67 and the gate of P channel transistor 100 and the second source/drain of P channel transistor 98 connected to bitline 66. A BLR signal is connected to the first source/drains of N channel transistors 102 and 104. The second source/drains of N channel transistors 102 and 104 are connected to respective source/drains of N channel transistor 106. The gates of N channel transistors 102, 104 and 106 are connected to an EQ signal. The second source/drain of N channel transistor 102 and a first source/drain of N channel transistor 106 are connected to bitline 66; the second source/drain of N channel transistor 104 and the second source/drain of N channel transistor 106 are connected to bitline 67.

N channel transistors 108 and 110 have gates connected to a DIGATE signal, first source/drain is connected to bitlines 66 and 67, respectively, and second source/drains connected to lines 112 and 114, respectively. Lines 112 and 114 are connected to first source/drains of N channel transistors 116 and 118. The first source/drain of N channel transistor 116 is connected to the gate of N channel transistor 118 and the first source/drain of N channel transistor 118 is connected to the gate of N channel transistor 116. $V_{ss}$ (shown as ground) is connected to line 120 through a N channel transistor 122 which has its gate connected the NC signal. Line 120 is connected to the second source/drains of N channel transistors 116 and 118. Line 112 is connected to the first source/drain of N channel transistor 124 and line 114 is connected to the first source/drain of N channel transistor 126. The gates of N channel transistors 124 and 126 are connected to the signal ROGATE. The second source/drain of N channel transistor 124 is connected to the first source/drain of N channel transistors 128 and 130. The second source/drain of N channel transistor 126 is connected to the first source/drain of N channel transistor 132 and to the second source/drain of N channel transistor 132. The gates of N channel transistors 128, 130 and 132 are connected to the EQ signal. The second source/drains of N channel transistors 130 and 132 are connected to the BLR signal. The second source/drains of N channel transistors 124 and 126 are also connected to bitlines 70 and 72. Bitlines 70 and 72 are also connected to the first source/drains of P channel transistors 134 and 136. The first source/drain of P channel transistor 134 is connected to the gate of P channel transistor 136 and the gate of P channel transistor 134 is connected to the first source/drain of P channel transistor 136. $V_{dd}$ is connected to line 138 through P channel transistor 140. The gate of P channel transistor 140 is connected to the signal PC0ROG. Line 138 is connected to the second source/drains of P channel transistors 134 and 136.

In operation, P channel transistors 98 and 100 will latch onto the higher of the voltages on bitlines 66 and 67. The cross-coupled P channel transistors amplify the higher signal by coupling the bitline with the higher voltage to $V_{dd}$ through P channel transistor 96 (if transistor 96 is enabled). N channel transistors 116 and 118 latch onto the lower of the two voltages on lines 112 and 114, and couple the lower line to ground. P channel transistors 136 latch onto the higher of the voltages on bitlines 70 and 72, and couple the higher bitline to $V_{dd}$.

N channel transistors 108, 110, 124 and 126 selectively isolate the lines 112 and 114 from the bit lines 66, 67, 70 and 72. Hence, by providing a high signal on the DIGATE line, line 112 is connected to bit line 66 and line 114 is connected to bit line 67. Similarly, by providing a high signal on the ROGATE, line 112 is connected to bit line 70 and line 114 is connected to bit line 72. Hence, the cross-coupled N channel transistors 116 and 118 may be shared between the DIR 11 ad memory R0 12. Normally, the DIGATE and ROGATE signals will not both be set high at the same time; however, during equalization of the bit lines (setting the EQ signal high and the BLR signal to $V_{dd}/2$), both ROGATE and DIGATE may be set high.

Figures 6A, 6B:
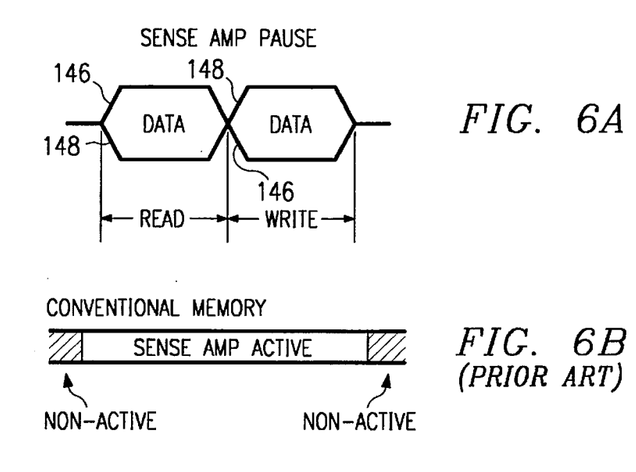
FIGS. 6a–d are timing diagrams of sense amplifier operation.
Figure 6C:
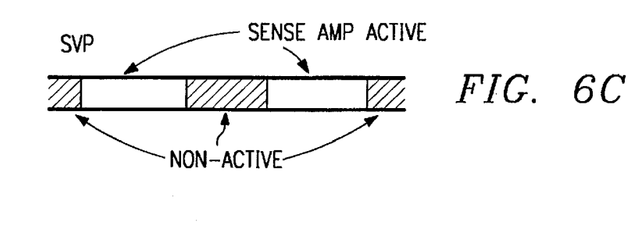
Figure 6D:
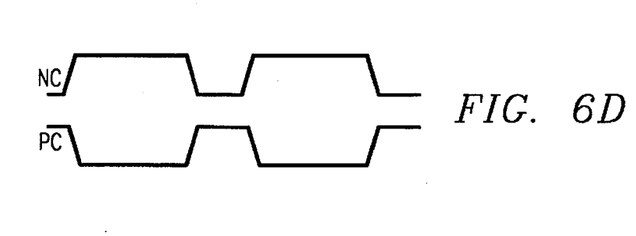

Referring to FIGS. 5 and 6, a novel aspect of the preferred embodiment is illustrated. During a sense operation, it is possible that a complementary pair of transistors, i.e., transistors 98 and 116, 100 and 118, 134 and 116 or 136 and 118, may be biased such that both transistors are enabled. For example, if the voltage on the gates of transistors 100 and 118 is such that both transistors are enabled, a low impedance path could exist between $V_{dd}$ and ground. This a particular problem in a parallel processor such as the SVP 10, because there may be simultaneous low impedance paths in all 1024 sense amplifiers, which would result in a large current through the processor. In the preferred embodiment, however, P channel transistors 96 and 140 and N channel transistor 122 are connected between the source/drain regions of the various transistors and the power rails, $V_{dd}$ and ground. By generating the proper control signals turn "off" to the transistors 96, 122 and 140, the sense amplifier may be "paused" or "passivated" during the period in which the low impedance path would otherwise exist.

FIG. 6a illustrates a timing diagram for the processor during a READ and WRITE cycle. Lines 146 and 148 may be thought of as the voltage on the bit lines 66 and 67. As shown in FIG. 6b, a conventional sense amplifier is active during the entire READ/WRITE cycle. However, as discussed above, this may lead to a large voltage spike if parallel processing is being performed. As shown in FIG. 6c, the sense amplifier of the preferred embodiment is not active during the first half of the writing. By deactivating the sense amplifier during the critical period, the voltage spikes are avoided.

FIG. 6d illustrates the control signals input to the transistors 96, 122 and 140. The PC signal is input to P channel transistors 96 and 140 (PC0DIG or PC0ROG, depending upon which memory is being sensed) and the NC signal is input to the N channel transistor 122. When the NC signal is pulled high, the N channel transistor 122 connects the sources of N channel transistors 116 and 118 to ground. When NC is low, a high impedance separates the drains from ground. Similarly, when the PC signal is low, $V_{dd}$ (typically five volts) is connected to the drains of P channel transistors 98 and 100. When the PC signal is high, $V_{dd}$ is decoupled from the sources of transistors 98 and 100. Hence, when NC is low and PC is high, there can be no current flow between $V_{dd}$ and ground.

In the preferred embodiment, the NC signal leads the PC signal slightly, thereby enabling N channel sensing first.

Figure 7:
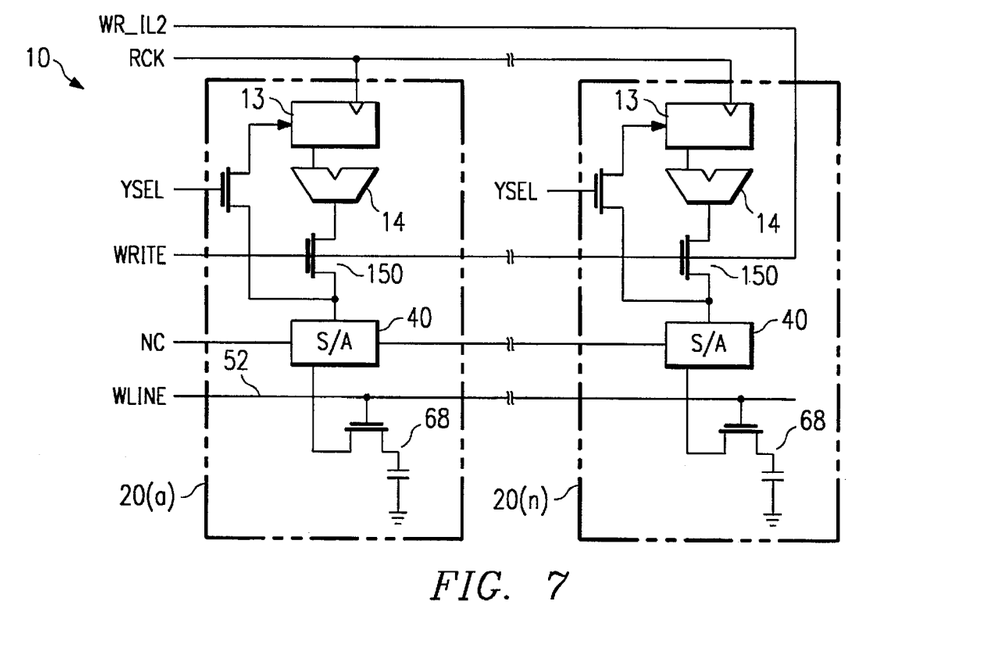
FIG. 7 is a block diagram of the processor of FIG. 1 showing signals for passivating sense amplifier activity.

FIG. 7 illustrates a block diagram of a circuit used to reactivate the sense amplifier 40 such that the amplifier is activated precisely when the ALU calculation is complete. In embodiments not including an ALU, the sense amplifier in general is activated by an operation complete signal derived from the associated circuit for which the sense amplifier is paused or made to wait. If the sense amplifier is reactivated too soon, the calculated data may not be ready. On the other hand, if the sense amplifier is activated too late, the writing time must be extended, which will slow up the speed of the processor.

FIG. 7 illustrates a block diagram of the SVP 10, showing the control lines which activate the sense amplifier at the proper times to ensure the validity of the data written thereto. A RCK (Register Clock) signal clocks the registers 13 of each processing element 20(*a*–*n*). The WRITE signal is coupled to the gates of pass gates 150 which couple the output of the ALU to the sense amplifiers 40 of each processing element 20. The WRITE signal propagates through each processing element and exits as signal WR_IL2, which accounts for the propagation delay of the WRITE signal through the device. The NC and PC (not shown) signals are coupled to each sense amplifier 40. The sense amplifiers 40 and wordlines (WLINE) 52 are connected to the memory cells 68 of the memories R0.

Figure 8:
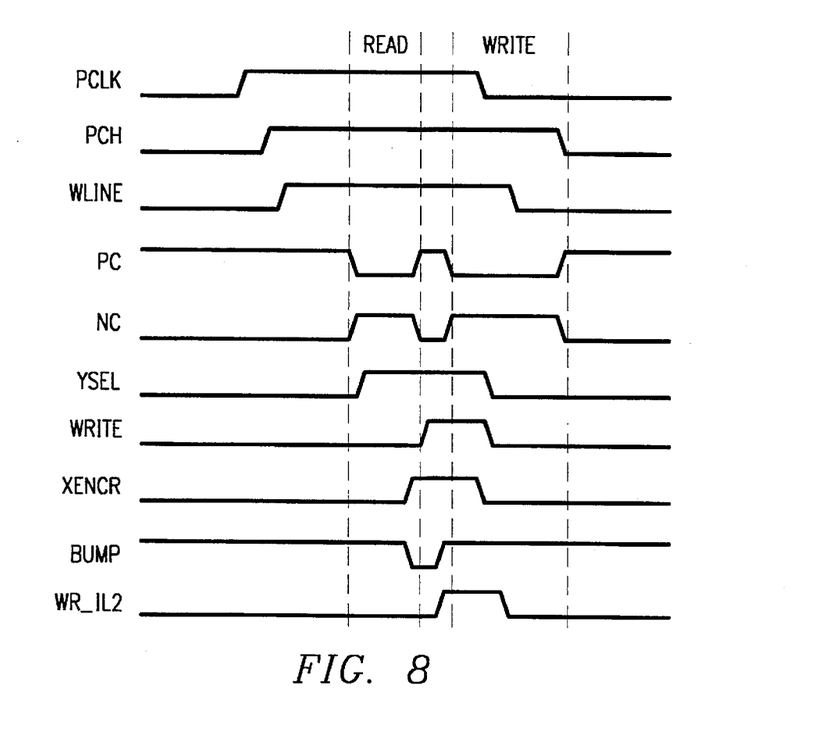
FIG. 8 is shows detailed timing signals for sense amplifier passivation.

FIG. 8 shows a detailed timing diagram of the important signals which produce the proper sense amplifier activation. The PCLK signal is an external signal whose leading edge starts a calculation cycle. After the leading edge of the PCLK signal, the PCH (precharge) signal is deactivated. Subsequently, the WLINE (wordline) signal to the addressed memory cell is activated.

After another delay to ensure that all the selected wordlines are activated, the NC and PC signals are activated to allow the sense amplifier to sense data from the selected memory cells. The YSEL signal is activated after data from the sense amplifier is valid and the data from the sense amplifier propagates to the registers 13. The RCK (Register Clock) signal is interlocked with the Ysel signal and clocks the data from the sense amplifiers to the registers 13.

The XENCR signal is interlocked to the Ysel signal. When the XENCR signal is activated, the leading edge of the BUMP signal (active low) is formed. The leading edge of the BUMP signal deactivates the NC and PC signals, thereby passivating the sense amplifier. After a short delay, the WRITE signal is activated, which couples the output of the ALU with the sense amplifier. Passivating the sense amplifier during the beginning of the write signal prevents the aforementioned low impedance path caused by crossover currents in the sense amplifier, and further, speeds the sensing operation.

It is desirable to reactivate the sense amplifier as soon as the calculation is completed in the ALU. The WR_IL2 (write interlocked feedback) signal may be used to form the trailing (rising) edge of the BUMP signal, which reactivates the sense amplifier. Alternatively, a dummy ALU set up for the longest possible propagation delay could be used to indicated the end of the calculation in the ALU. Thereafter, the WLINE signal turns off and the precharging begins again.

This aspect of the preferred embodiment provides a low noise sensing operation, while minimizing any delay associated with passivating the sense amplifier.

Other preferred embodiments implement the inventive aspects in video RAM, frame RAMs, image system processors and other memories, processors data storage and transfer circuits operating on electrical or optical or any other suitable technology.

Although the preferred embodiment has been described in detail, it should be understood that various changes, substitutions and alterations can be made herein without departing from the spirit and scope of the invention as defined by the appended claims.

What is claimed is:

1. An integrated circuit having a first sense amplifier, said first sense amplifier comprising:

first and second sensing nodes;

high sensing circuitry for coupling a first voltage node associated with a first voltage source to one of said first or second sensing node responsive to a voltage differential between said first and second sensing nodes during a read portion of a read-modify-write cycle;

third and fourth sensing nodes;

low sensing circuitry for coupling a second voltage node associated with a second voltage source to one of said third or fourth sensing nodes responsive to a voltage differential between said third or fourth sensing nodes during said read portion of said read-modify-write cycle;

coupling circuitry connected to said third and fourth sensing nodes for coupling a source of write data to said sense amp during a write portion of said read-modify-write cycle; and pause circuitry for selectively decoupling at least one of said voltage nodes from its respective voltage source prior to coupling said write data in order to prevent a low impedance connection between the voltage sources when said write data is coupled to said sense amplifier during said write portion of said read-modify-write cycle.

2. The sense amplifier of claim 1 wherein said first node is associated with the Vdd power rail.

3. The sense amplifier of claim 1 wherein said second node is associated with the ground power rail.

4. The sense amplifier of claim 1 wherein said pause circuitry comprises:

first switching circuitry operable to selectively couple said first voltage node to said first voltage source responsive to a first control signal;

second switching circuitry operable to selectively couple said second voltage node to said second voltage source responsive to a second control signal; and circuitry for generating said first and second control signals.

5. The sense amplifier of claim 4 wherein said first switching circuitry comprises a p-channel transistor.

6. The sense amplifier of claim 4 wherein said second switching circuitry comprises an n-channel transistor.

7. The sense amplifier of claim 4 wherein said generating circuitry comprises circuitry for generating said first and second control signals responsive to a deactivation control signal indicative of data being read from the sense amplifier during said read portion of said read-modify-write cycle.

8. The sense amplifier of claim 1 and further comprising:

fifth and sixth sensing nodes;

second high sensing circuitry for coupling a third voltage node associated with a third voltage source to one of said fifth or sixth sensing nodes responsive to a voltage differential between said fifth and six sensing nodes; and isolation circuitry for selectively isolating said first node from said third node, said second node from said fourth node, said fifth node from said third node and said sixth node from said fourth node such that said low sensing circuitry can be used to sense signals associated with two separate memories.

9. The sense amplifier of claim 8 wherein said isolation circuitry comprises a plurality of transistors coupled between sense nodes.

10. The sense amplifier of claim 1 wherein said high sensing circuitry comprises first and second p-channel transistors, said first p-channel transistor having a gate coupled to said second sense node, a first source/drain coupled to said first voltage node and a second source/drain coupled to said first sense node and said second p-channel transistor having a gate coupled to said first sense node, a first source/drain coupled to said first voltage node and a second source/drain coupled to said second sense node.

11. The sense amplifier of claim 11 wherein said low sensing circuitry comprises first and second n-channel transistors, said first n-channel transistor having a gate coupled to said fourth sense node, a first source/drain coupled to said second voltage node and a second source/drain coupled to said third sense node and said second n-channel transistor having a gate coupled to said third sense node, a first source/drain coupled to said second voltage node and a second source/drain coupled to said fourth sense node.

12. A method of operating a sense amplifier during a read-modify-write cycle comprising the steps of:

sensing high signals responsive to a voltage differential between first and second sense nodes during a read portion of said read-modify-write cycle;

coupling one of said first or second sense nodes to a high logic node responsive to said voltage differential between said first and second nodes;

sensing low signals responsive to a voltage differential between third and fourth sense nodes during said read portion of said read-modify-write cycle;

coupling one of said third or fourth sense nodes to a low logic node responsive to said voltage differential between said third and fourth nodes;

selectively decoupling at least one of said voltage nodes from its respective voltage source after said read portion of said read-modify-write cycle and prior to a write portion of said read-modify-write cycle in order to prevent a low impedance connection between the first and second voltage sources.

13. The method of claim 12 wherein said step of coupling one of said first or second sense nodes to a high logic node comprises the step of coupling one of said first or second sense nodes to Vdd.

14. The method of claim 12 wherein said step of coupling one of said third or fourth sense nodes to a low logic node comprises the step of coupling one of said third or fourth sense nodes to ground.

15. The method of claim 12 wherein said step of selectively decoupling comprises the steps of:

selectively decoupling said first voltage node from said first voltage source responsive to a first control signal; and selectively decoupling said second voltage node from a second voltage source responsive to a second control signal.

16. The sense amplifier of claim 7 wherein said generating circuitry comprises circuitry for generating said first and second control signals responsive to a reactivation control signal indicative of data which is stable being coupled to the sense amplifier during said write portion of said read-modify-write cycle.

17. The integrated circuit of claim 16, further comprising:

an arithmetic logic unit (ALU) connected to said sense amplifier and operational to receive said data being read from said sense amplifier, said ALU being connected to said coupling circuitry and being operational to source said write data, said ALU having a propagation time for receiving said data being read and processing said read data to form said write data; and reactivation control circuitry operational to assert said reactivation control signal promptly upon the completion of said propagation time.

18. The integrated circuit of claim 1, further comprising:

a single bit arithmetic logic unit (ALU) connected to said sense amplifier and operational to receive said data being read from said sense amplifier, said ALU being connected to said coupling circuitry and being operational to source said write data; and a second sense amplifier connected to said ALU being operationally distinct from said first sense amplifier.

19. The method of claim 12, where the step of selectively decoupling further comprises:

deactivating said sense amplifier after read data has been sensed during said read portion of said read-modify-write cycle; and reactivating said sense amplifier after data to be written is coupled to said sense amplifier during said write portion of said read-modify-write cycle.

20. The method of claim 12 and further comprising the steps of:

sensing high signals responsive to a voltage differential between fifth and six sense nodes;

coupling one of said fifth or six sense nodes to a high logic node responsive to said voltage differential between said fifth and six nodes; and selectively isolating said fifth and sixth nodes from said third and forth nodes, respectively, and selectively isolating said first and second nodes from said third and fourth nodes, respectively.

* * * * *